US010958193B2

(12) United States Patent
Arakawa et al.

(10) Patent No.: US 10,958,193 B2
(45) Date of Patent: Mar. 23, 2021

(54) PIEZOELECTRIC DRIVING DEVICE, ELECTRONIC-COMPONENT-TRANSPORTING DEVICE, ROBOT, PROJECTOR, AND PRINTER

(71) Applicant: Seiko Epson Corporation, Tokyo (JP)

(72) Inventors: Yutaka Arakawa, Hara (JP); Tomohisa Iwazaki, Shimosuwa (JP)

(73) Assignee: Seiko Epson Corporation ( * ) Notice: Subject to any disclaimer, the term of this patent is extended or adjusted under 35 U.S.C. 154(b) by 511 days.

(21) Appl. No.: 15/949,438

(22) Filed: Apr. 10, 2018

(65) Prior Publication Data
US 2018/0294747 A1 Oct. 11, 2018

(30) Foreign Application Priority Data
Apr. 11, 2017 (JP) .............................. JP2017-078005

(51) Int. Cl.
H02N 2/02 (2006.01)
G03B 21/14 (2006.01)
B25J 9/12 (2006.01)
B41J 2/14 (2006.01)
H01L 21/677 (2006.01)

(52) U.S. Cl.
CPC ................ *H02N 2/026* (2013.01); *B25J 9/12* (2013.01); *B41J 2/14201* (2013.01); *G03B 21/142* (2013.01); *H02N 2/028* (2013.01); *G03B 2205/0061* (2013.01); *H01L 21/67706* (2013.01); *Y10S 901/23* (2013.01)

(58) Field of Classification Search
CPC ...... H02N 2/026; H02N 2/028; H02N 2/0025; H02N 2/067; G03B 21/142; G03B 2205/0061; B25J 9/12; B25J 9/123; B41J 2/14201; Y10S 901/23; H01L 21/67706
See application file for complete search history.

(56) References Cited

U.S. PATENT DOCUMENTS 5,416,375 A * 5/1995 Funakubo .............. H02N 2/004
310/317
6,252,333 B1 6/2001 Iino et al.
8,164,233 B2 4/2012 Mukae
(Continued)

FOREIGN PATENT DOCUMENTS

JP 11-271480 A 10/1999
JP 2008-067479 A 3/2008
(Continued)

*Primary Examiner* — Emily P Pham
(74) *Attorney, Agent, or Firm* — Harness, Dickey & Pierce, P.L.C.

(57) ABSTRACT

A piezoelectric device includes a first member, a second member, a guide mechanism that guides the second member relative to the first member in a first direction, and a piezoelectric actuator that moves the second member relative to the first member in the first direction, the guide mechanism including a first rail and a second rail spaced apart from the first rail in a second direction orthogonal to the first direction, and the piezoelectric actuator, when viewed from a third direction orthogonal to both the first direction and the second direction, being disposed between the first rail or an extended line obtained by extending the first rail in the first direction and the second rail or an extended line obtained by extending the second rail in the first direction.

20 Claims, 9 Drawing Sheets

(56) References Cited

U.S. PATENT DOCUMENTS

| | | | |
|---|---|---|---|
| 2007/0096598 A1* | 5/2007 | Ichikawa | H02N 2/026 310/323.02 |
| 2013/0140951 A1* | 6/2013 | Kamijo | H02N 2/103 310/323.16 |
| 2015/0137663 A1* | 5/2015 | Kimura | H02N 2/0015 310/323.02 |
| 2016/0241165 A1 | 8/2016 | Miyazawa | |
| 2018/0088298 A1 | 3/2018 | Nishitani | |
| 2018/0254717 A1* | 9/2018 | Zhelyaskov | H02N 2/026 |

FOREIGN PATENT DOCUMENTS

| | | |
|---|---|---|
| JP | 2016-152705 A | 8/2016 |
| JP | 2017-011977 A | 1/2017 |

\* cited by examiner

PIEZOELECTRIC DRIVING DEVICE, ELECTRONIC-COMPONENT-TRANSPORTING DEVICE, ROBOT, PROJECTOR, AND PRINTER

BACKGROUND

1. Technical Field

The present invention relates to a piezoelectric driving device, an electronic-component-transporting device, a robot, a projector and a printer.

2. Related Art

Conventionally, as a piezoelectric driving device using a piezoelectric actuator that vibrates a vibration body with a piezoelectric element to drive a driven member, for example, a device such as a stage described in JP-A-11-271480, is known.

The stage described in JP-A-11-271480 includes a support base, a first mobile body placed on the support base, a second mobile body placed on the first mobile body, a first piezoelectric actuator abutting against a side surface of the first mobile body, and a second piezoelectric actuator abutting against a side surface of the second mobile body.

Here, by providing the support base and the first mobile body with two guide rails on the support base and two guide grooves on the first mobile body corresponding to the two guide rails of the support base, the support base and the first mobile body can be guided in a predetermined direction and are movable relative to each other, and the first piezoelectric actuator is installed on the support base while being pressed toward the first mobile body outside the area between the two guide rails of the support base. Similarly, by providing the first mobile body and the second mobile body with two guide rails on the first mobile body and two guide grooves on the second mobile body corresponding to the two guide rails of the first mobile body, the first mobile body and the second mobile body can be guided in a predetermined direction and are movable relative to each other, and the second piezoelectric actuator is installed on the first mobile body while being pressed toward the second mobile body outside the area between the two guide rails of the first mobile body.

However, the stage described in JP-A-11-271480 has a problem in that, because each of the piezoelectric actuators is disposed outside the region between the two guide rails, a moment about the guide rail is applied to the mobile body as a result of pressing from the piezoelectric actuators toward the mobile body and the mobile body consequently tilts.

SUMMARY

An advantage of some aspects of the invention is that a piezoelectric driving device capable of moving two members relative to each other in a stable attitude, and an electronic-component-transporting device, a robot, a projector, and a printer each including the piezoelectric driving device are provided.

A piezoelectric driving device according to a first aspect of the invention includes a first member, a second member, a guide mechanism that guides the second member relative to the first member in a first direction, and a piezoelectric actuator that moves the second member relative to the first member in the first direction, the guide mechanism including a first rail provided on one of the first member and the second member along the first direction and a second rail provided on one of the first member and the second member along the first direction while being spaced apart from the first rail in a second direction orthogonal to the first direction, and the piezoelectric actuator, when viewed from a third direction orthogonal to both the first direction and the second direction, being disposed between the first rail or an extended line obtained by extending the first rail in the first direction and the second rail or an extended line obtained by extending the second rail in the first direction.

According to such a piezoelectric driving device, because the piezoelectric actuator is disposed between the first rail (or the extended line thereof) and the second rail (or the extended line thereof) when viewed from the third direction, even if the actuator is pressed between the first member and the second member, tilting of the second member relative to the first member due to the pressing force can be reduced.

In the piezoelectric driving device according to the first aspect of the invention, it is preferable that the piezoelectric actuator be supported by the second member while being pressed against the first member or a member fixed to the first member in the third direction.

Consequently, it is possible to efficiently transmit the driving force of the piezoelectric actuator to the first member or a member fixed to the first member.

In the piezoelectric driving device according to the first aspect of the invention, it is preferable that the piezoelectric actuator be provided in a plurality and that the guide mechanism include a first slider which is provided on a member different from the member provided with the first rail among the first member and the second member and which is movable along the first rail, and a second slider which is provided on a member different from the member provided with the second rail among the first member and the second member and which is movable along the second rail, and the center of a pressing force from the plurality of piezoelectric actuators to the first member is located in a region between the first slider and the second slider when viewed from the third direction.

Consequently, even when the piezoelectric actuators are pressed between the first member and the second member, it is possible to more accurately reduce the tilting of the second member relative to the first member due to the pressing force.

In the piezoelectric driving device according to the first aspect of the invention, it is preferable that the first rail and the second rail both be provided on the first member or on the second member.

Consequently, it is possible to reduce a change in the shape and size of the region between the first slider and the second slider with the movement of the first slider and the second slider relative to the first rail and the second rail. Therefore, the degree of freedom of installation of the piezoelectric actuator can be increased.

In the piezoelectric driving device according to the first aspect of the invention, it is preferable that the first slider and the second slider be arranged so as to be displaced apart from each other in the first direction.

Consequently, it is possible to reduce variations in the positional relationship between the first member and the second member. In addition, it is possible to lengthen the region between the first slider and the second slider in the first direction while keeping the length of the first slider and the second slider small in the first direction, and as a result, the degree of freedom of installation of the piezoelectric actuator can be increased.

An electronic-component-transporting device according to a second aspect of the invention includes the piezoelectric driving device according to the first aspect of the invention. According to such an electronic-component-transporting device, by utilizing the action and effect that the piezoelectric driving device can move two members relative to each other in a stable attitude, it is possible to perform highly accurate operation of the electronic-component-transporting device.

A robot according to a third aspect of the invention includes the piezoelectric driving device according to the first aspect of the invention. It is possible to perform highly accurate operation of such a robot by utilizing the action and effect that the piezoelectric driving device can move two members relative to each other in a stable attitude.

A projector according to a fourth aspect of the invention includes the piezoelectric driving device according to the first aspect of the invention. It is possible to perform highly accurate operation of such a projector by utilizing the action and effect that the piezoelectric driving device can move two members relative to each other in a stable attitude.

A printer according to a fifth aspect of the invention includes the piezoelectric driving device according to the first aspect of the invention. It is possible to perform highly accurate operation of such a printer by utilizing the action and effect that the piezoelectric driving device can move two members relative to each other in a stable attitude.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, a piezoelectric driving device, an electronic-component-transporting device, a robot, a projector, and a printer according to the invention will be described in detail based on preferred embodiments illustrated in the accompanying drawings.

1. Piezoelectric Driving Device

Figure 1:
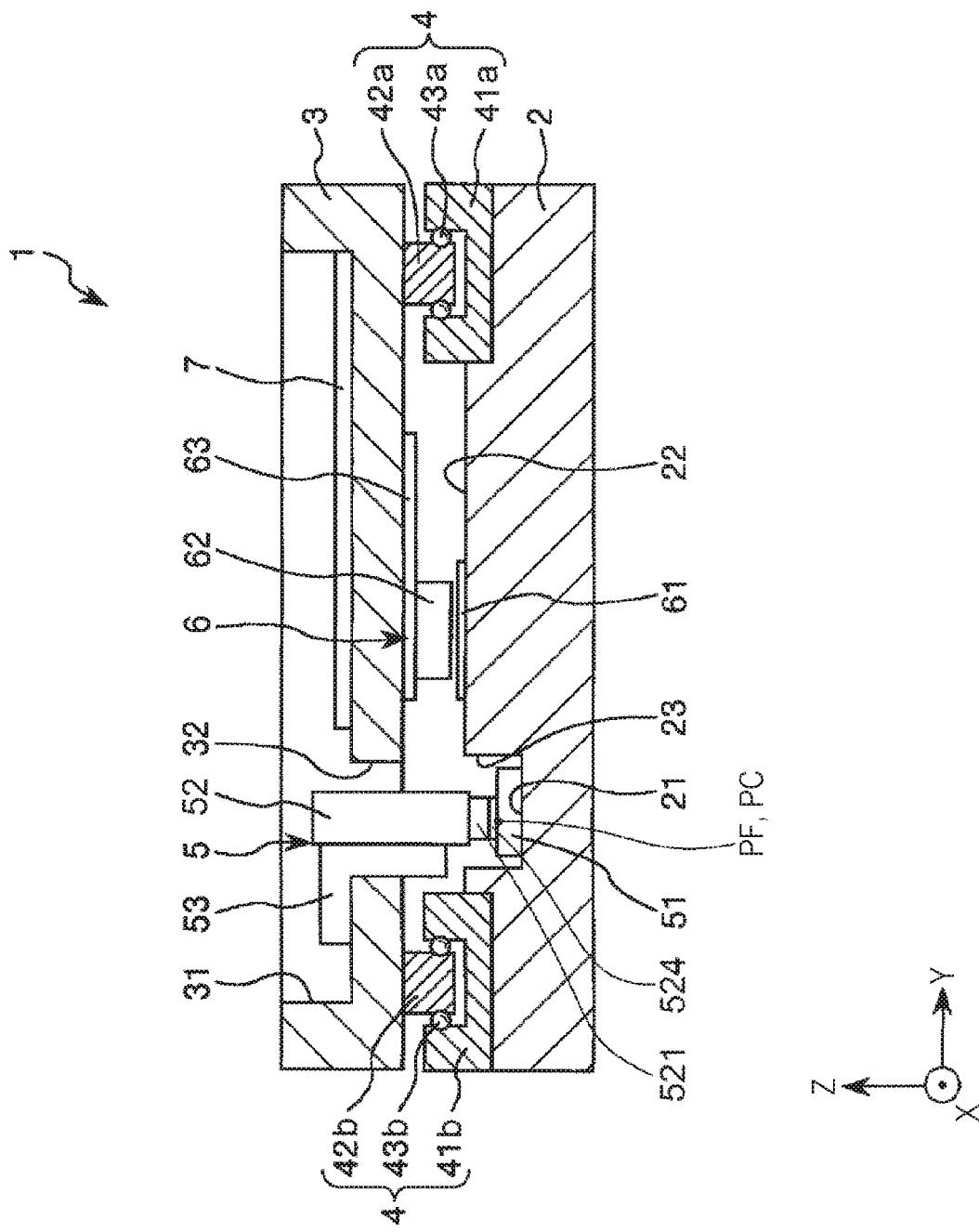
FIG. 1 is a cross-sectional view illustrating a piezoelectric driving device according to an embodiment of the invention.
Figure 2:
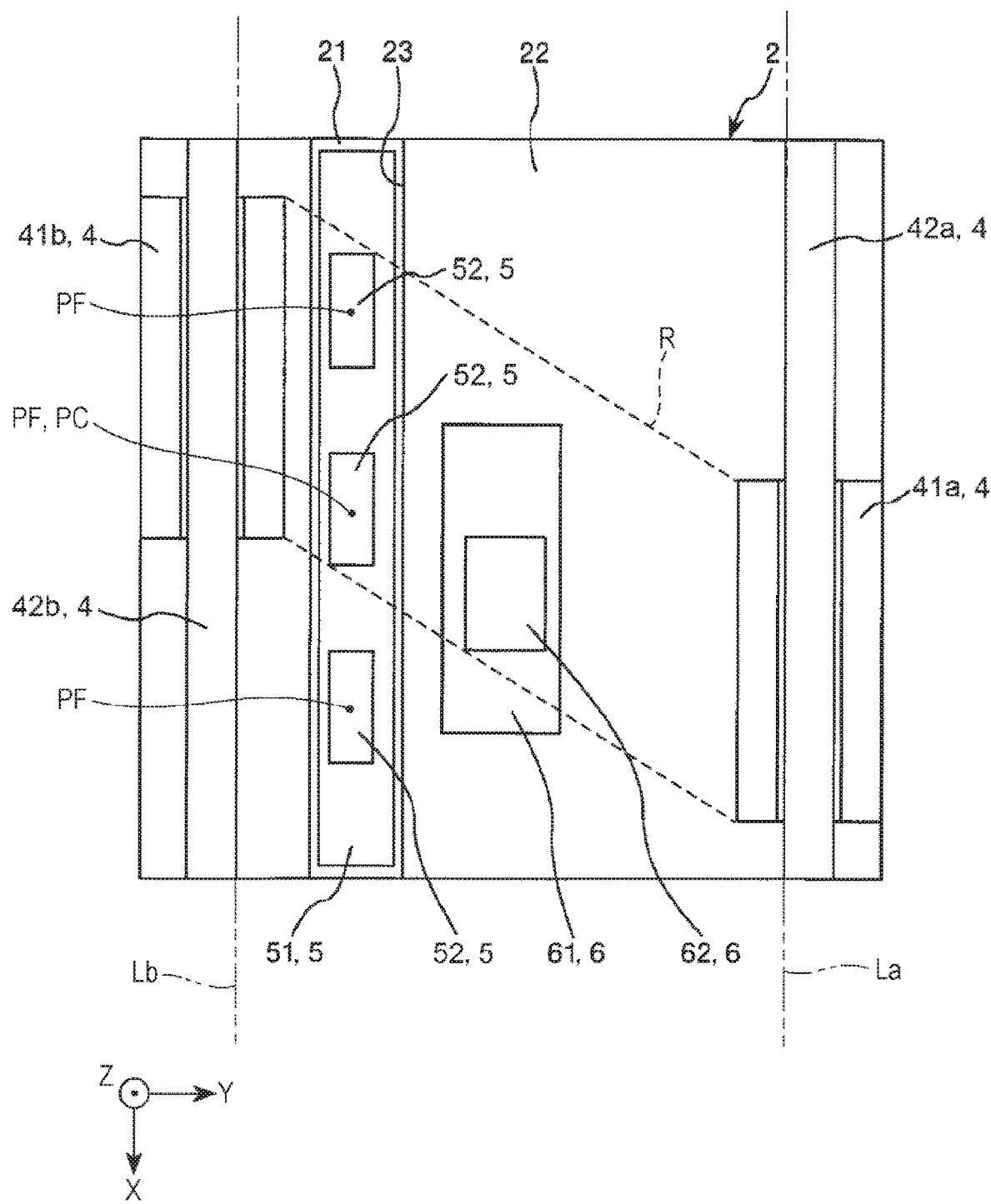
FIG. 2 is a plan view (a view seen from the Z-axis direction) of the piezoelectric driving device illustrated in FIG. 1.
Figure 3:
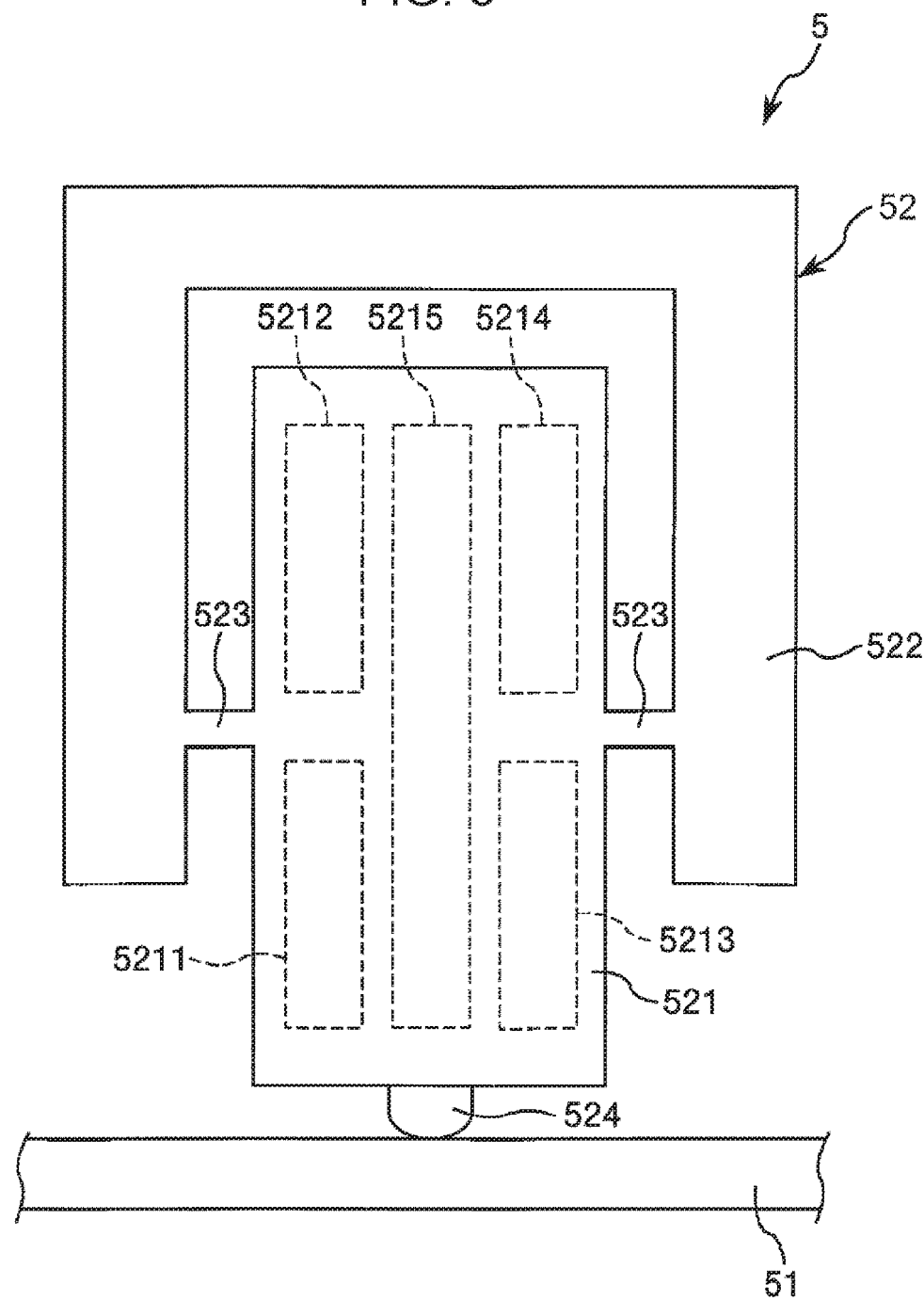
FIG. 3 is a plan view of a piezoelectric actuator included in the piezoelectric driving device illustrated in FIG. 1.
Figure 4:
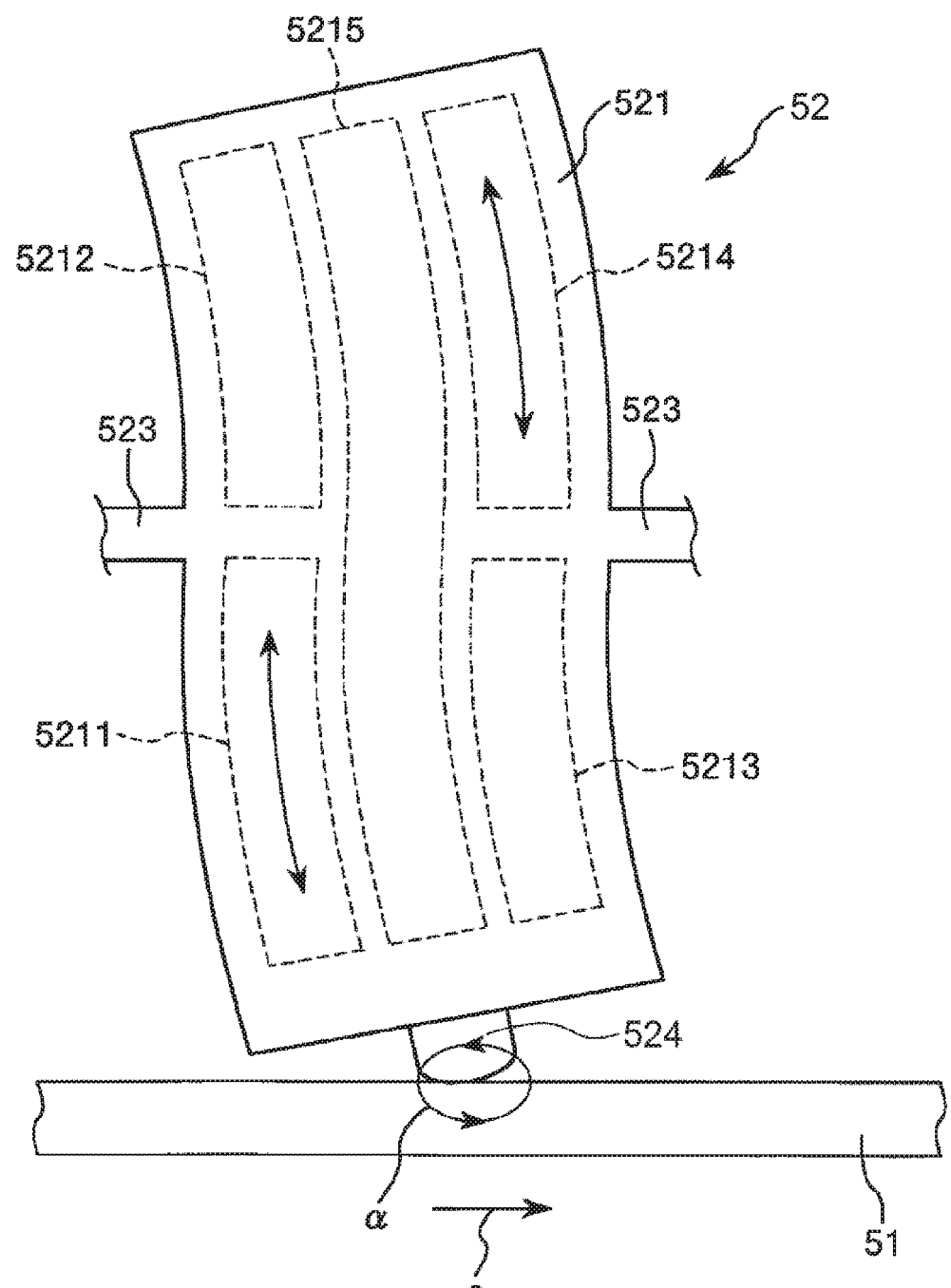
FIG. 4 is a view for explaining the operation of the piezoelectric actuator illustrated in FIG. 3.

FIG. 1 is a cross-sectional view illustrating a piezoelectric driving device according to an embodiment of the invention. FIG. 2 is a plan view (a view seen from the Z-axis direction) of the piezoelectric driving device illustrated in FIG. 1. FIG. 3 is a plan view of a piezoelectric actuator included in the piezoelectric driving device illustrated in FIG. 1. FIG. 4 is a view for explaining the operation of the piezoelectric actuator illustrated in FIG. 3.

Further, in the following description, for convenience of explanation, explanation will be made by appropriately using an X axis, a Y axis, and a Z axis as three axes orthogonal to each other. In addition, in the figures described below, the tips of the arrows indicating these axes correspond to "+" and the bases correspond to "−". In addition, the direction parallel to the X axis is referred to as the "X-axis direction", the direction parallel to the Y axis is referred to as the "Y-axis direction", and the direction parallel to the Z axis is referred to as the "Z-axis direction". In addition, the plane parallel to both the X axis and the Y axis (the plane having a normal line in the Z-axis direction) is referred to as the "XY plane" and the plane parallel to both the X axis and the Z axis (the plane having a normal line in the Y-axis direction) is referred to as the "XZ plane". The plane parallel to both the Y axis and the Z axis (the plane having a normal line in the X-axis direction) is referred to as the "YZ plane". In addition, the +Z-axis direction side is also referred to as "upper", and the −Z-axis direction side is also referred to as "lower". In addition, a view from the Z-axis direction is referred to as "plan view". In addition, in FIG. 2, for the sake of convenience of explanation, a portion of a drive unit 5, a portion of a detection unit 6, and a second member 3 are omitted.

As illustrated in FIG. 1, a piezoelectric driving device 1 includes a first member 2, the second member 3, a guide mechanism 4 that guides the second member 3 so as to move relative to the first member 2 in the X-axis direction (the depth direction of the page in FIG. 1), the drive unit that moves the second member 3 relative to the first member 2 in the X-axis direction, the detection unit 6 (encoder) that detects relative movement of the second member 3 in the X-axis direction relative to the first member 2, and a circuit unit 7 that operates the drive unit 5 and the detection unit 6.

Each of the first member 2 and the second member 3 is formed of, for example, a metal material, a ceramic material or the like, and has a substantially plate-like overall shape along the XY plane. In addition, although the outer shapes of the first member 2 and the second member 3 in plan view are rectangular (quadrangular), respectively, they are not limited to this and other polygonal shapes such as pentagonal, circular, and elliptical shapes may be used.

Here, as illustrated in FIG. 1, a recessed portion 23 is formed on one surface (the upper side in FIG. 1) of the first member 2. The bottom surface of the recessed portion 23 constitutes an installation surface 21 on which a driven member 51 of the drive unit 5 described below is installed. In addition, on one surface (the upper side in FIG. 1) of the first member 2, an installation surface 22 on which an optical scale 61 of the detection unit 6 described later is installed is provided outside the recessed portion 23. As illustrated in FIG. 2, the recessed portion 23 extends along the X-axis direction, and along with this, the installation surface 21 also extends along the X-axis direction.

As illustrated in FIG. 1, on one surface (the upper side in FIG. 1) of the second member 3, a recessed portion 31 that opens on the opposite side to the first member 2 is formed. In addition, in the second member 3, a hole 32 that opens to the bottom surface of the recessed portion 31 and penetrates the second member 3 in the thickness direction (Z-axis direction) is formed.

The guide mechanism 4 is a linear motion bearing and is disposed between the first member 2 and the second member 3 as illustrated in FIG. 1. The guide mechanism 4 includes a first slider 41a and a second slider 41b, which are a pair of sliders, a first rail 42a and a second rail 42b which are a pair of rails provided corresponding to the first slider 41a and the second slider 41b, a plurality of balls 43a provided between the first slider 41a and the first rail 42a, and a plurality of balls 43b provided between the second slider 41b and the second rail 42b.

The first rail 42a and the second rail 42b are arranged so as to extend along the X-axis direction, respectively, and are fixed to the second member 3 using, for example, screws or the like. In addition, one or both of the first rail 42a and the second rail 42b may be integrally formed with the second member 3. In this embodiment, the first rail 42a and the second rail 42b are provided over the entire region of the second member 3 in the X-axis direction. Further, the first rail 42a and the second rail 42b may be provided over a position and range necessary for the movement of the first slider 41a and the second slider 41b or may be provided in a portion of the second member 3 in the X-axis direction. In addition, unlike the illustration, one of the first rail 42a and the second rail 42b may be fixed to the first member 2 and the other may be fixed to the second member 3.

The first slider 41a and the second slider 41b are movable along the first rail 42a and the second rail 42b, respectively, and are fixed to the first member 2 using, for example, screws or the like. In addition, one or both of the first slider 41a and the second slider 41b may be integrally formed with the first member 2. In this embodiment, the first slider 41a and the second slider 41b are each provided in a respective portion of the first member 2 in the X-axis direction. In addition, the first slider 41a and the second slider 41b are provided in the first member 2 at positions shifted from each other in the X-axis direction. In addition, the length of the first slider 41a in the X-axis direction is shorter than the length of the first rail 42a in the X-axis direction and similarly the length of the second slider 41b in the X-axis direction is shorter than the length of the second rail 42b in the X-axis direction. Further, the first slider 41a and the second slider 41b may be provided over a position and range necessary for movement along the first rail 42a and the second rail 42b. In addition, one of the first slider 41a and the second slider 41b may be fixed to the first member 2 and the other may be fixed to the second member 3.

The guide mechanism 4 such as that described above is configured to restrict (limit) the relative movement of the first member 2 and the second member 3 in directions other than the X-axis direction. Further, the guide mechanism 4 may be configured to restrict (limit) the relative movement of the first member 2 and the second member 3 in the X-axis direction within a predetermined range.

The drive unit 5 includes the driven member 51 installed (fixed) on the first member 2, a plurality (three by way of example) of piezoelectric actuators 52 that transmit a driving force to the driven member 51, and a plurality (three by way of example) of support members 53 that support the plurality of the piezoelectric actuators 52 relative to the second member 3.

The driven member 51 is installed on the installation surface 21 of the above-described first member 2, and is fixed to the first member 2 by, for example, fitting, adhesion with an adhesive, screwing, or the like. In addition, the driven member 51 may be integrally formed with the first member 2. The driven member 51 has a plate shape or a sheet shape and is formed of a material having relatively high wear resistance such as a ceramic material. In addition, as illustrated in FIG. 4, the driven member 51 extends along the X-axis direction.

The plurality of piezoelectric actuators 52 are arranged side by side along the X-axis direction. In this embodiment, the piezoelectric actuators 52 are provided biasedly on one side (the left side in FIG. 2) of the second member 3 in the Y-axis direction. In particular, the plurality of piezoelectric actuators 52 are arranged such that the center PC of the load points PF thereof (hereinafter also simply referred to as the "center PC of the piezoelectric actuators 52") in plan view (as viewed from the Z-axis direction) is located in the region R between the first slider 41a and the second slider 41b of the guide mechanism 4 described above. Consequently, even if the piezoelectric actuators 52 (protruding portions 524) are brought into contact with (pressed against) the driven member 51 at a predetermined pressure as described later, it is possible to reduce tilting of the second member 3 relative to the first member 2 due to the pressing force.

Further, if the piezoelectric actuators 52, in plan view, are arranged in a region between the first rail 42a or an extension line La of the first rail 42a in the X-axis direction (first direction) and the second rail 42b or an extension line Lb of the second rail 42b in the X-axis direction (first direction) (more preferably, between the first rail 42a and the second rail 42b), the effect of reducing the tilting of the second member 3 relative to the first member 2 can be exerted as compared with the case where the piezoelectric actuators 52 are arranged outside that region. However, as long as the center PC of the piezoelectric actuators 52 is provided in the region R in plan view, the effect thereof is particularly marked and the arrangement of the plurality of piezoelectric actuators 52 is not limited to the arrangement illustrated.

Here, as illustrated by a chain line in FIG. 2, the region R is a quadrangle (a parallelogram in the figure) in plan view. This region R moves relative to the second member 3 with the relative movement (change in the positional relationship) of the first member 2 and the second member 3 in the X-axis direction. The center PC of the piezoelectric actuators 52 is located within the region R in plan view regardless of the change in the relative positional relationship between the first member 2 and the second member 3. Further, the "load point PF" is the center (geometric) of the force (load) acting on the driven member (the first member 2 or a member fixed thereto) from each of the piezoelectric actuators 52, specifically, is the center of the contact portion between the protruding portion 524 and the driven member 51, which will be described later. The force (load) acting on the driven member 51 from each of the piezoelectric actuators 52 is caused by elastic deformation of an elastic member (not illustrated) described later. In addition, the "center PC" is the center of the plurality of load points PF, and the center (the center of the total load) of the force (load) acting on the driven member 51 from the plurality (three in this embodiment) of the piezoelectric actuators 52.

As illustrated in FIG. 3, each of the piezoelectric actuators 52 has a vibration portion 521, a support portion 522, a pair of connecting portions 523 connecting these portions, and the protruding portion 524 protruding from the vibration portion 521.

The vibration portion 521 has a plate shape along the XZ plane. In addition, the vibration portion 521 has an elongated shape extending along the Z-axis direction. The vibration portion 521 includes a piezoelectric element 5215 disposed along the longitudinal direction of the vibration portion 521 at the center of the vibration portion 521 in the width direction (X-axis direction), two piezoelectric elements 5211 and 5212 arranged along the vibration portion 521 in the longitudinal direction on one side of the vibration portion 521 in the width direction relative to the piezoelectric element 5215, and two piezoelectric elements 5213 and 5214 arranged along the vibration portion 521 in the longitudinal direction on the other side of the vibration portion 521 in the width direction relative to the piezoelectric element 5215.

Although not illustrated, the vibration portion 521 such as that described above is composed of, for example, two substrates such as two silicon substrates, a piezoelectric body such as a lead zirconate titanate (PZT) body disposed between these substrates, and a plurality of electrodes provided on both sides of the piezoelectric body as appropriate. Here, each of the support portion 522 and the pair of connecting portions 523 has, for example, two substrates integrally formed with the two substrates of the above-described vibration portion 521. In addition, in the support portion 522, for example, an insulating spacer having substantially the same thickness as that of the piezoelectric body included in the vibration portion 521 is interposed between the two substrates.

The protruding portion 524 protrudes in the longitudinal direction (Z-axis direction) from a width-direction center portion of one end (the lower end in FIG. 3) portion (the distal end portion) of the vibration portion 521. The protruding portion 524 is formed of, for example, a material having excellent abrasion resistance such as a ceramic material, and is joined to the vibration portion 521 with an adhesive or the like. The protruding portion 524 has a function of transmitting vibration of the vibration portion 521 to the driven member 51 by frictional sliding and therefore can be said to be a transmitting portion. Further, the shape of the protruding portion 524 (transmitting portion) may be any shape as long as it can transmit the driving force of the vibration portion 521 to the driven member 51, and is not limited to the illustrated shape.

The support member 53 is formed of, for example, a metal material, a ceramic material, or the like, and is fixed to each of the support portion 522 and the second member 3 using, for example, screws or the like. Here, the support member 53 and the support portion 522 are connected via an elastic member (not illustrated), and the support portion 522 is fixed to the second member 3 via the support member 53 so that, with the elastic deformation of the elastic member, the protruding portion 524 contacts (presses) the driven member 51 with a predetermined pressure.

The piezoelectric actuator 52 included in the drive unit 5 such as that described above operates by appropriately inputting drive signals having predetermined frequencies from the circuit unit 7 to the piezoelectric elements 5211 to 5215. For example, by setting the phase difference between the drive signal to the piezoelectric elements 5211 and 5214 and the drive signal to the piezoelectric elements 5212 and 5213 to 180°, and setting the phase difference between the drive signal to the piezoelectric elements 5211 and 5214 and the drive signal to the piezoelectric element 5215 to 30°, as illustrated in FIG. 4, the vibration portion 521 flexurally vibrates in an S shape due to expansion and contraction of the respective piezoelectric elements 5211 to 5215, and consequently the tip of the protruding portion 524 elliptically moves in the direction indicated by the arrow α in the drawing. As a result, the driven member 51 repeatedly receives a driving force from the protruding portion 524 in one direction (the direction indicated by the arrow β in the drawing). As a result, the first member 2 and the second member 3 move relative to each other in the X-axis direction.

In addition, in the case where the first member 2 and the second member 3 are to be moved relative to each other in the X-axis direction in a direction opposite to the case illustrated in FIG. 4, a drive signal may be applied to the piezoelectric element 5215 so that the phase difference between the drive signal applied to the piezoelectric element 5215 and the drive signal applied to the piezoelectric elements 5211 and 5214 is 210°. Further, in the illustrated configuration, the driven member 51 is installed on the first member 2 side and the piezoelectric actuator 52 is installed on the second member 3 side, conversely, however, the driven member 51 may be installed on the second member 3 side, and the piezoelectric actuator 52 may be installed on the first member 2 side.

The detection unit 6 illustrated in FIG. 1 and FIG. 2 is an optical linear encoder. As illustrated in FIG. 1, the detection unit 6 includes the optical scale 61 installed on the first member 2, a sensor 62 that detects movement of the optical scale 61, and a substrate 63 that supports the sensor 62 relative to the second member 3.

The optical scale 61 is installed on the installation surface 22 of the first member 2 and is fixed to the first member 2 using, for example, an adhesive or the like. The optical scale 61 is, for example, a slit plate, a polarizing plate, or the like. In addition, as illustrated in FIG. 2, the optical scale 61 extends along the X-axis direction.

Although not illustrated, the sensor 62 includes a light-emitting element such as a semiconductor laser that irradiates the optical scale 61 with light and a light-receiving element such as a photodiode that receives reflected light from the optical scale 61.

The substrate 63 is, for example, a wiring board, and is fixed to the second member 3 by using screws or the like. The substrate 63 is installed on a surface of the second member 3 on the opposite side to the recessed portion 31, supports the sensor 62, and is electrically connected to the sensor 62 and the circuit unit 7, respectively.

In the detection unit 6 as described above, the waveform of the output signal of the light-receiving element of the sensor 62 (position, movement speed, and the like) changes in accordance with the relative movement state (position, movement speed, and the like) of the second member 3 in the X-axis direction relative to the first member 2. Therefore, the relative movement state of the second member 3 in the X-axis direction relative to the first member 2 can be detected on the basis of the output signal of the light-receiving element.

The circuit unit 7 is installed in the recessed portion 31 of the second member 3 described above. The circuit unit 7 has a circuit that operates the piezoelectric actuators 52 and the sensor 62 described above. For example, the circuit unit 7 includes a driving circuit that drives the piezoelectric actuators 52 (generating driving signals), a driving circuit that drives the light-emitting element of the sensor 62, an arithmetic circuit that calculates the relative position of the second member 3 relative to the first member 2 on the basis of a signal from the light-receiving element of the sensor 62, and the like. Further, a circuit (a driving circuit and an arithmetic circuit) for the sensor 62 of the circuit unit 7 may be incorporated in the detection unit 6, and, in such a case, it may be integrated with the sensor 62. In addition, the circuit unit 7 may be provided outside the piezoelectric driving device 1.

As described above, the piezoelectric driving device 1 includes the first member 2, the second member 3, the guide mechanism 4 that guides the second member 3 along the X-axis direction (first direction) relative to the first member 2, and the piezoelectric actuators 52 that move the second member 3 relative to the first member 2 in the X-axis direction (first direction). Here, the guide mechanism 4 includes the first rail 42a provided along the X-axis direction (first direction) on the second member 3 (either one of the first member 2 or the second member 3) and the second rail 42b provided so as to be separate from the first rail 42a in the Y-axis direction (second direction) perpendicular to the X-axis direction (first direction) and provided on the second member 3 (either one of the first member 2 or the second member 3) along the X-axis direction (first direction).

In particular, when viewed from the Z-axis direction (third direction) orthogonal to both the X-axis direction (the first direction) and the Y-axis direction (the second direction), the piezoelectric actuators 52 are disposed between the first rail 42a or an extended line La of the first rail 42a along the X-axis direction (first direction) and the second rail 42b or an extended line Lb of the second rail 42b along the X-axis direction (first direction). Consequently, even when the piezoelectric actuators 52 are pressed between the first member 2 and the second member 3, it is possible to reduce tilting of the second member 3 relative to the first member 2 due to the pressing force.

Here, the piezoelectric actuators 52 are supported by the second member 3 in a state of being pressed against the driven member 51 (the first member 2 or a member fixed thereto) in the Z-axis direction (third direction). Consequently, the driving force of the piezoelectric actuators 52 can be efficiently transmitted to the first member 2 or a member (the driven member 51) fixed to the first member 2.

In this embodiment, a plurality of the piezoelectric actuators 52 (three in this embodiment) are provided. In addition, the guide mechanism 4 includes the first slider 41a that is provided on the first member 2 (a member on the opposite side to the first rail 42a among the first member 2 and the second member 3) movable along the first rail 42a and the second slider 41b which is provided on the first member 2 (a member on the opposite side to the second rail 42b among the first member 2 and the second member 3) and is movable along the second rail 42b. The center PC of the pressing force of the plurality (three in this embodiment) of the piezoelectric actuators 52 that is applied to the first member 2 (the driven member 51), when viewed from the Z-axis direction (the third direction), is located in the region R between the first slider 41a and the second slider 41b. Consequently, even when the piezoelectric actuators 52 are pressed between the first member 2 and the second member 3, it is possible to more accurately reduce tilting of the second member 3 relative to the first member 2 due to the pressing force.

In addition, both the first rail 42a and the second rail 42b are provided on the second member 3. Consequently, it is possible to reduce a change in the shape and size of the region R between the first slider 41a and the second slider 41b with the movement of the first slider 41a and the second slider 41b relative to the first rail 42a and the second rail 42b. Therefore, the degree of freedom of installation of the piezoelectric actuators 52 can be increased. Further, unlike the illustration, even if both the first rail 42a and the second rail 42b are provided in the first member 2, the same effect is exerted. In this case, both the first slider 41a and the second slider 41b may be provided in the second member 3.

In addition, the first slider 41a and the second slider 41b are arranged so as to be displaced away from each other in the X-axis direction (first direction). Consequently, it is possible to reduce variations in the positional relationship between the first member 2 and the second member 3. In addition, the region R between the first slider 41a and the second slider 41b can be elongated in the X-axis direction while keeping the length of the first slider 41a and the second slider 41b small in the X-axis direction and, as a result, it is possible to increase the degree of freedom in setting the piezoelectric actuators (in particular, the degree of freedom in the X-axis direction).

2. Electronic-Component-Transporting Device

Figure 5:
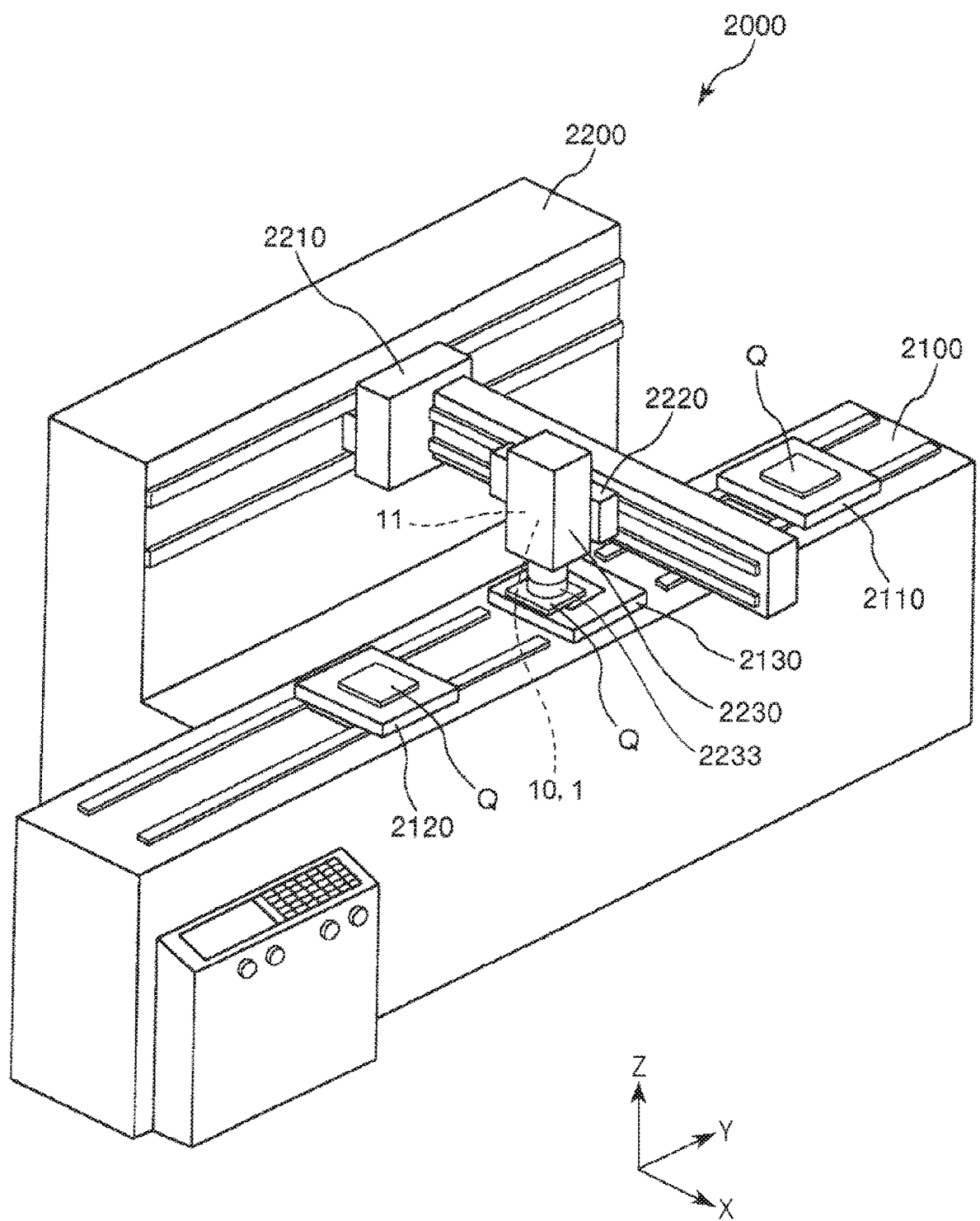
FIG. 5 is a perspective view illustrating an embodiment of an electronic-component-transporting device of the invention.

Next, an embodiment of an electronic-component-transporting device of the invention will be described. FIG. 5 is a perspective view illustrating an embodiment of an electronic-component-transporting device of the invention.

An electronic-component-transporting device 2000 illustrated in FIG. 5 is applied to an electronic component inspection device, and includes a base 2100 and a support base 2200 arranged on the side of the base 2100. In addition, the base 2100 is provided with an upstream stage 2110 on which an electronic component Q to be inspected is placed and transported in the Y-axis direction, a downstream stage 2120 on which the inspected electronic component Q is placed and transported in the Y-axis direction, and an inspection base 2130 which is positioned between the downstream stage 2120 and the upstream stage 2110 and which inspects the electrical characteristics of the electronic component Q. Further, examples of the electronic component Q include a semiconductor, a semiconductor wafer, a display device such as a CLD or an OLED, a quartz crystal device, various sensors, an ink jet head, various MEMS devices, and the like.

In addition, a Y stage 2210 movable relative to the support base 2200 in the Y-axis direction is provided on the support base 2200, and an X stage 2220 movable relative to the Y stage 2210 in the X-axis direction is provided with an electronic component holding portion 2230 movable relative to the X stage 2220 in the Z-axis direction.

In addition, the electronic component holding portion 2230 includes a piezoelectric driving device 10 that is a positioning unit that performs minute positioning about the X-axis direction, the Y-axis direction, and the Z-axis direction, a holding portion 2233 that holds the electronic component Q, and a pressing mechanism portion 11 that is capable of moving the holding portion 2233 in the Z-axis direction via the piezoelectric driving device 10. Here, the holding portion 2233 is supported by the pressing mechanism portion 11 via the piezoelectric driving device 10. The pressing mechanism portion 11 is, for example, a pneumatic cylinder or a hydraulic cylinder, is supported by the X stage 2220 (support), and is configured to be capable of moving the piezoelectric driving device 10 in the Z-axis direction. The pressing mechanism portion 11 is capable of pressing the holding portion 2233 (electronic component Q) toward one of the platforms (objects), namely, the upstream stage 2110, the downstream stage 2120, or the inspection base 2130 via the piezoelectric driving device 10.

Figure 6:
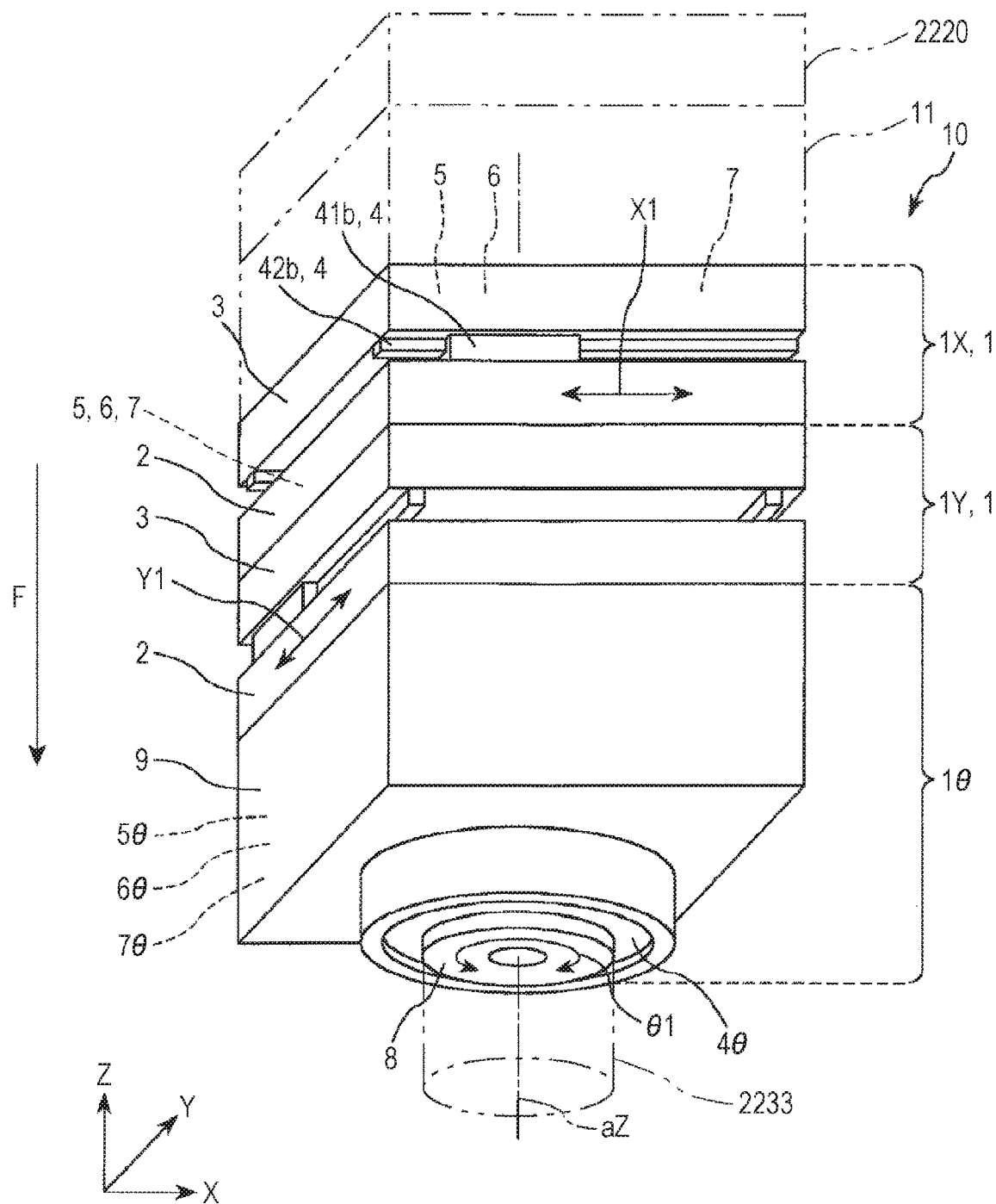
FIG. 6 is a perspective view illustrating a schematic configuration of the piezoelectric driving device included in the electronic-component-transporting device illustrated in FIG. 5.

The piezoelectric driving device 10 illustrated in FIG. 6 is a piezoelectric driving unit that performs driving in the X-axis direction (the direction indicated by the arrow X1 in the drawing), the Y-axis direction (the direction indicated by the arrow Y1 in the drawing) and around the Z-axis (the direction indicated by the arrow θ1 in the drawing). The piezoelectric driving device 10 includes a piezoelectric driving device 1X (first piezoelectric driving device) that performs driving in the X-axis direction, a piezoelectric driving device 1Y (second piezoelectric driving device) that performs driving in the Y-axis direction, and a piezoelectric driving device 1θ (third piezoelectric driving device) that performs driving around the Z-axis, and these are connected side by side in the Z-axis direction.

Here, each of the piezoelectric driving devices 1X and 1Y is the piezoelectric driving device 1 described above. However, the attitude of the piezoelectric driving device 1Y in the XY plane is different from that of the piezoelectric driving device 1X by 90°. Here, the second member 3 of the piezoelectric driving device 1X is fixed to the above-described pressing mechanism portion 11 using, for example, screws, bolts and nuts, or the like. In addition, the second member 3 of the piezoelectric driving device 1Y is fixed to the first member 2 of the piezoelectric driving device 1X using screws, bolts and nuts or the like so as to have the aforementioned attitude.

The piezoelectric driving device 1θ includes a first member 8, a second member 9, a bearing 4θ that supports and enables rotational movement of the second member 9 relative to the first member 8 about an axis line aZ (in the direction indicated by the arrow θ1 in FIG. 3) parallel to the Z axis, a drive unit 5θ that enables rotational movement of the second member 9 relative to the first member 8 about the axis line aZ, a detection unit 6θ (encoder) for detecting rotation of the second member 9 relative to the first member 8 about the axis line aZ, and a circuit unit 7θ for operating the drive unit 5θ and the detection unit 6θ. Here, the aforementioned holding portion 2233 is fixed to the first member 8 by using, for example, screws, bolts and nuts, or the like. In addition, the drive unit 5θ has the piezoelectric actuators 52, and by the driving force thereof, enables rotational movement of the second member 9 relative to the first member 8 around the axis line aZ.

As described above, the electronic-component-transporting device 2000 includes the piezoelectric driving device 1 (10). This makes it possible to perform highly accurate operation of the electronic-component-transporting device 2000 by utilizing the action and effect that the piezoelectric driving device 1 can move two members relative to each other in a stable attitude.

3. Robot

Figure 7:
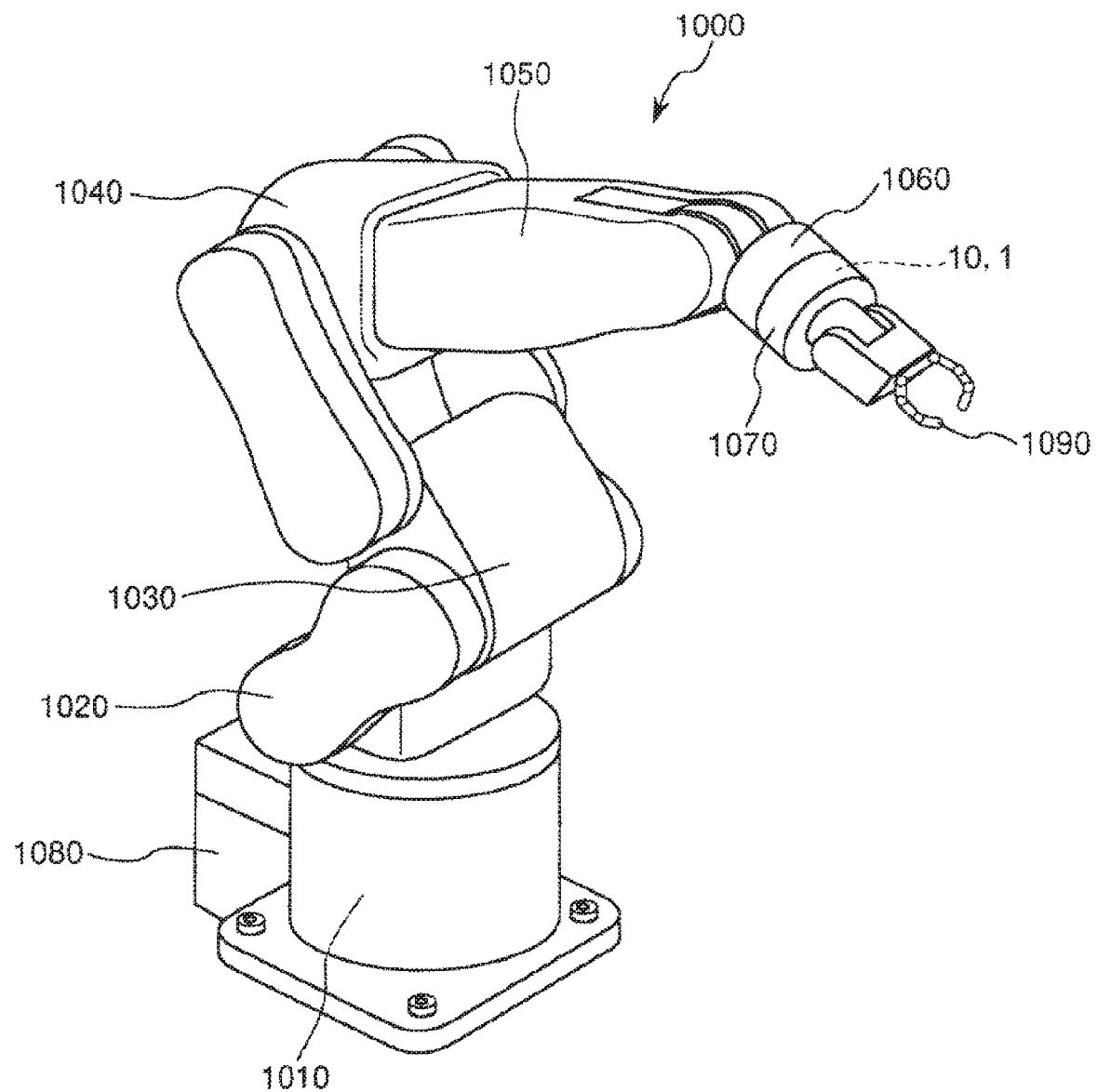
FIG. 7 is a perspective view illustrating an embodiment of a robot of the invention.

Next, an embodiment of a robot of the invention will be described. FIG. 7 is a perspective view illustrating an embodiment of a robot of the invention.

A robot 1000 illustrated in FIG. 7 can perform operations such as supply, removal, transportation and assembly of precision instruments and constituent components (objects) thereof. The robot 1000 is a six-axis robot, and includes a base 1010 fixed to a floor or a ceiling, an arm 1020 connected to the base 1010 so as to be freely rotatable, an arm 1030 connected to the arm 1020 so as to be freely rotatable, an arm 1040 connected to the arm 1030 so as to be freely rotatable, an arm 1050 connected to the arm 1040 so as to be freely rotatable, an arm 1060 connected to the arm 1050 so as to be freely rotatable, an arm 1070 connected to the arm 1060 so as to be freely rotatable, and a control unit 1080 that controls driving of the arms 1020, 1030, 1040, 1050, 1060, and 1070. In addition, the arm 1070 is provided with a hand-connecting portion (not illustrated) as a holding portion via the piezoelectric driving device 10, and an end effector 1090 (member) that corresponds to the work to be executed by the robot 1000 is mounted on the hand-connecting portion. In addition, driving of the piezoelectric driving device 10 is controlled by the control unit 1080.

As described above, the robot 1000 includes the piezoelectric driving device 1 (10). Consequently, it is possible to perform highly accurate operation of the robot 1000 by utilizing the action and effect that the piezoelectric driving device 1 can move two members relative to each other with a stable attitude. Further, the piezoelectric driving device 1 (10) may be provided at an arbitrary position other than the arm 1070 of the robot 1000.

4. Projector

Figure 8:
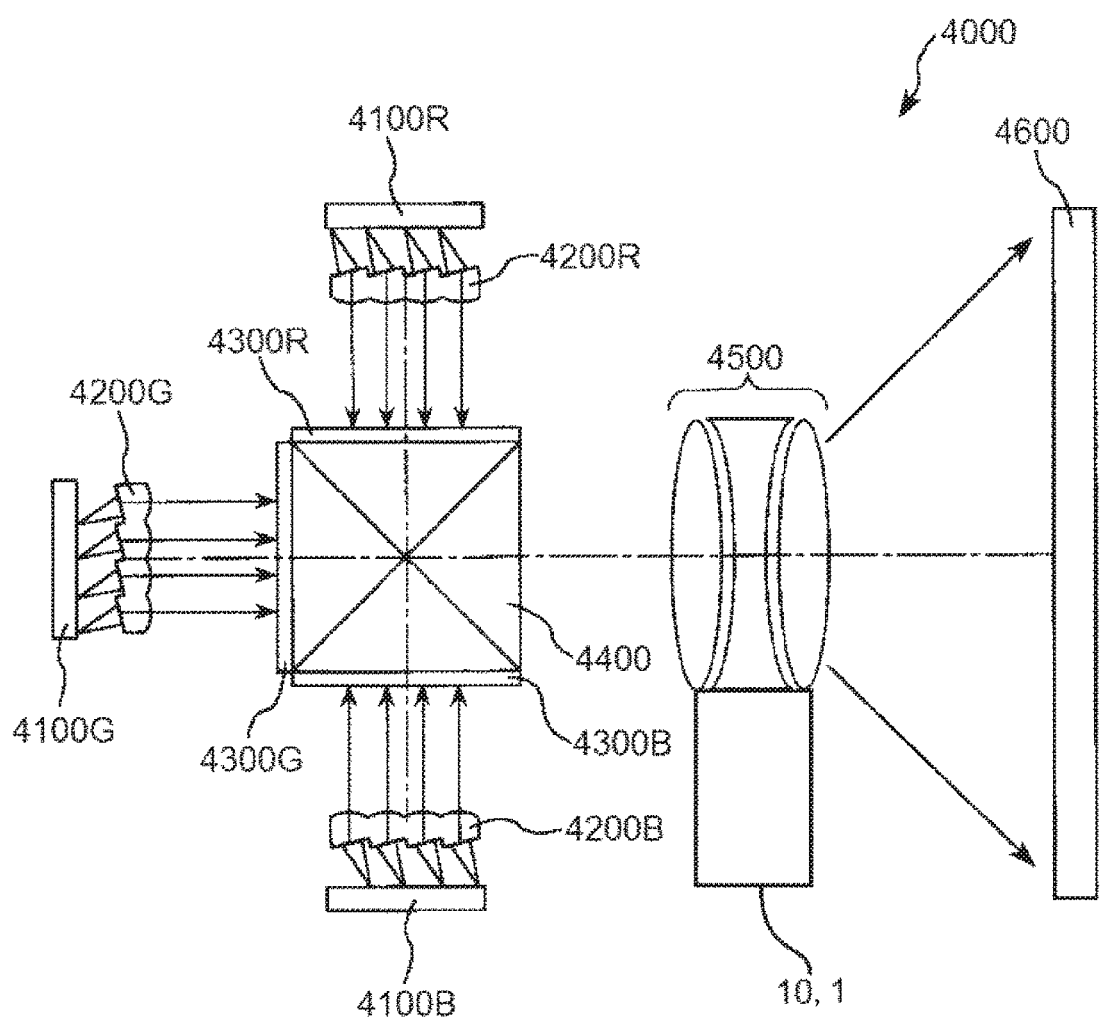
FIG. 8 is a schematic diagram illustrating an embodiment of a projector of the invention.

FIG. 8 is a schematic diagram illustrating an embodiment of a projector of the invention.

A projector 4000 illustrated in FIG. 8 includes a red light source 4100 R, a green light source 4100 G, a blue light source 4100 B, lens arrays 4200 R, 4200 G, and 4200 B that emit red light, green light, and blue light respectively, transmission type liquid crystal light valves (light modulators) 4300 R, 4300 G, and 4300 B, a cross-dichroic prism 4400, a projection lens 4500 (projection unit), and the piezoelectric driving device 10.

The light beams emitted from the light sources 4100 R, 4100 G, and 4100 B are made incident on the liquid crystal light valves 4300 R, 4300 G, and 4300 B via the lens arrays 4200 R, 4200 G, and 4200 B, respectively. Each of the liquid crystal light valves 4300R, 4300G, and 4300B modulates incident light in accordance with image information.

The three color light beams modulated by the liquid crystal light valves 4300 R, 4300 G, and 4300 B are made incident on the cross dichroic prism 4400 and combined. The light beams combined by the cross-dichroic prism 4400 are made incident on the projection lens 4500, which is a projection optical system. The projection lens 4500 enlarges the image formed by the liquid crystal light valves 4300 R, 4300 G, and 4300 B and projects the image on a screen (display surface) 4600. As a result, a desired image is displayed on the screen 4600. Here, the projection lens 4500 is supported by the piezoelectric driving device 10, and its position and attitude can be changed (positioned) by driving the piezoelectric driving device 10. Consequently, it is possible to adjust the shape and size of the image projected on the screen 4600.

Further, in the above example, a transmissive liquid crystal light valve is used as the light modulation unit, but a light valve other than a liquid crystal light valve may be used, or a reflective light valve may be used. Examples of such a light valve include reflective liquid crystal light valves and digital micromirror devices. In addition, the configuration of the projection optical system is appropriately changed according to the type of light valve used. In addition, the projector may be a scanning type projector that displays an image of a desired size on the display surface by causing light to scan on the screen.

As described above, the projector 4000 includes the piezoelectric driving device 1 (10). Consequently, the projector 4000 can be operated with high precision by utilizing the action and effect that the piezoelectric driving device 1 can move two members relative to each other in a stable posture.

5. Printer

Figure 9:
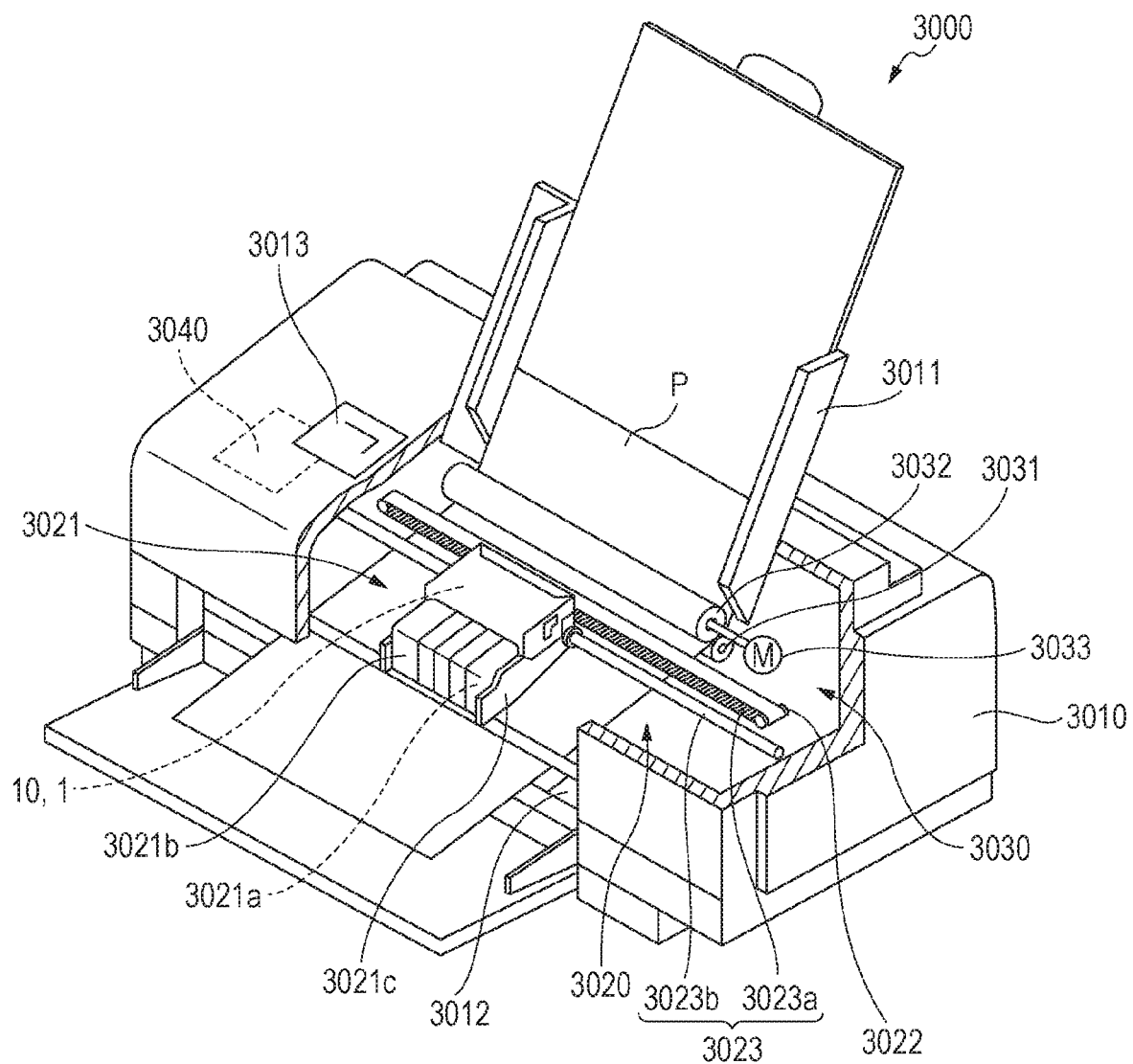
FIG. 9 is a perspective view illustrating an embodiment of a printer of the invention.

FIG. 9 is a perspective view illustrating an embodiment of a printer of the invention.

A printer 3000 illustrated in FIG. 9 is an inkjet recording type printer. The printer 3000 includes an apparatus main body 3010, a printing mechanism 3020 provided inside the apparatus main body 3010, a paper feed mechanism 3030, and a control unit 3040.

The apparatus main body 3010 is provided with a tray 3011 for setting the recording paper P, a paper discharge port 3012 for discharging the recording paper P, and an operation panel 3013 such as a liquid crystal display.

The printing mechanism 3020 includes a head unit 3021, a carriage motor 3022, and a reciprocating mechanism 3023 that reciprocates the head unit 3021 by the driving force of the carriage motor 3022. The head unit 3021 includes a head 3021a which is an ink jet type recording head, an ink cartridge 3021b which supplies ink to the head 3021a, a carriage 3021c on which the head 3021a and the ink cartridge 3021b are mounted, and the piezoelectric driving device 10. Here, the piezoelectric driving device 10 positions the head 3021a and the ink cartridge 3021b relative to the carriage 3021c. The reciprocating mechanism 3023 has a carriage guide shaft 3023a that supports the carriage 3021c so as to be capable of reciprocating and a timing belt 3023b that moves the carriage 3021c on the carriage guide shaft 3023a by the driving force of the carriage motor 3022.

The paper feed mechanism 3030 includes a driven roller 3031 and a drive roller 3032 that are in pressure contact with each other, and a paper feed motor 3033 that drives the drive roller 3032.

The control unit 3040 controls the printing mechanism 3020, the paper feed mechanism 3030, and the like on the basis of print data input from a host computer such as a personal computer.

In the printer 3000 such as that described above, the paper feed mechanism 3030 intermittently feeds sheets of recording paper P one by one to the vicinity of the lower portion of the head unit 3021. At this time, the head unit 3021 reciprocates in a direction substantially orthogonal to the feeding direction of the recording paper P and printing on the recording paper P is performed.

As described above, the printer 3000 includes the piezoelectric driving device 1 (10). Consequently, it is possible to perform highly precise operation of the printer 3000 by utilizing the action and effect that the piezoelectric driving device 1 can move two members relative to each other in a stable attitude.

Although the piezoelectric driving device, the electronic-component-transporting device, the robot, the projector, and the printer according to the invention have been described based on the illustrated embodiments, the invention is not limited to this, and it can be replaced with an arbitrary configuration having the same function. In addition, any other components may be added to the invention.

The entire disclosure of Japanese Patent Application No. 2017-078005, filed Apr. 11, 2017 is expressly incorporated by reference herein.

What is claimed is:

1. A piezoelectric driving device comprising:
   a first member,
   a second member,
   a guide mechanism that guides the second member relative to the first member in a first direction, and
   a piezoelectric actuator that moves the second member relative to the first member in the first direction,
   wherein the guide mechanism includes a first rail provided on one of the first member and the second member along the first direction and a second rail provided on one of the first member and the second member along the first direction while being spaced apart from the first rail in a second direction orthogonal to the first direction, and
   the piezoelectric actuator, when viewed from a third direction orthogonal to both the first direction and the second direction, is disposed between the first rail or an extended line obtained by extending the first rail in the first direction and the second rail or an extended line obtained by extending the second rail in the first direction.

2. The piezoelectric driving device according to claim 1, wherein the piezoelectric actuator is supported by the second member while being pressed against the first member or a member fixed to the first member in the third direction.

3. The piezoelectric driving device according to claim 2, wherein the piezoelectric actuator is provided in a plurality,
   the guide mechanism includes a first slider which is provided on a member different from the member provided with the first rail among the first member and the second member and which is movable along the first rail, and a second slider which is provided on a member different from the member provided with the second rail among the first member and the second member and which is movable along the second rail, and
   the center of a pressing force from the plurality of piezoelectric actuators to the first member is located in a region between the first slider and the second slider when viewed from the third direction.

4. The piezoelectric driving device according to claim 3, wherein the first rail and the second rail are both provided on the first member or on the second member.

5. The piezoelectric driving device according to claim 3, wherein the first slider and the second slider are arranged so as to be displaced apart from each other in the first direction.

6. An electronic-component-transporting device comprising:
   the piezoelectric driving device according to claim 1.

7. An electronic-component-transporting device comprising:
   the piezoelectric driving device according to claim 2.

8. An electronic-component-transporting device comprising:
   the piezoelectric driving device according to claim 3.

9. An electronic-component-transporting device comprising:
   the piezoelectric driving device according to claim 4.

10. An electronic-component-transporting device comprising:
    the piezoelectric driving device according to claim 5.

11. A robot comprising:
    the piezoelectric driving device according to claim 1.

12. A robot comprising:
    the piezoelectric driving device according to claim 2.

13. A robot comprising:
    the piezoelectric driving device according to claim 3.

14. A robot comprising:
    the piezoelectric driving device according to claim 4.

15. A robot comprising:
    the piezoelectric driving device according to claim 5.

16. A projector comprising:
    the piezoelectric driving device according to claim 1.

17. A projector comprising:
    the piezoelectric driving device according to claim 2.

18. A projector comprising:
    the piezoelectric driving device according to claim 3.

19. A projector comprising:
    the piezoelectric driving device according to claim 4.

20. A printer comprising:
    the piezoelectric driving device according to claim 1.

* * * * *